(12) United States Patent
Kawai

(10) Patent No.: US 6,453,091 B2
(45) Date of Patent: Sep. 17, 2002

(54) OPTICAL SYSTEM UNIT FOR OPTICAL TRANSCEIVER

(75) Inventor: Motoyoshi Kawai, Tokyo (JP)

(73) Assignee: NEC Corporation, Tokyo (JP)

( * ) Notice: Subject to any disclaimer, the term of this patent is extended or adjusted under 35 U.S.C. 154(b) by 98 days.

(21) Appl. No.: 09/725,892

(22) Filed: Nov. 30, 2000

(30) Foreign Application Priority Data

Jan. 12, 1999 (JP) .......................................... 11-341882

(51) Int. Cl.$^7$ ................................................ G02B 6/32
(52) U.S. Cl. .......................................... 385/33; 385/93
(58) Field of Search .............................. 385/31, 32, 33, 385/88–93

(56) References Cited

U.S. PATENT DOCUMENTS

| RE31,255 E | | 5/1983 | Geddes .......................... 357/19 |
| 4,737,008 A | * | 4/1988 | Ohyama et al. ............... 385/88 |
| 5,337,398 A | * | 8/1994 | Benzoni et al. ................ 385/52 |
| 6,243,508 B1 | * | 6/2001 | Jewell et al. .................. 385/14 |
| 6,328,484 B1 | * | 12/2001 | Uebbing ....................... 385/47 |

FOREIGN PATENT DOCUMENTS

| DE | 197 42 895 A 1 | 4/1999 |
| GB | 2 330 425 A | 4/1999 |

OTHER PUBLICATIONS

European Search Report dated Feb. 26, 2001.

* cited by examiner

Primary Examiner—Ellen E. Kim
(74) Attorney, Agent, or Firm—McGinn & Gibb, PLLC

(57) ABSTRACT

An optical system unit for optical transceiver is fabricated integral with lenses by molding of a resin material for providing a desired level of the optical characteristics with no use of mirrors. The optical system unit for optical transceiver 201 for optically coupling with a connector 202 having a fiber optic cable 205 has a pair of convex lenses 212 and 213 thereof provided to face the coupling end of a transmission optical fiber 203 and the coupling end of a reception optical fiber 204 respectively. The two lenses 212 and 213 may be identical in the optical characteristics. A lead frame 215 having two steps is provided beneath the two lenses 212 and 213. A light emitting device 216 and a light receiving device 217 are mounted on the two, upper and lower, steps of the lead frame 215 respectively. The lead frame 215 is carefully bent at a certain angle, aligned with the axes of the optical fibers, and embedded in the resin material. In the molding of the resin material, the two convex lenses 212 and 213 are formed integrally. The optical system unit 201 employing no mirrors can hardly be susceptible to a change in the ambient temperature.

10 Claims, 6 Drawing Sheets

OPTICAL SYSTEM UNIT FOR OPTICAL TRANSCEIVER

FIELD OF THE INVENTION

The present invention relates to an optical system unit for optical transceiver and particularly an optical system unit for optical transceiver arranged of receptacle type for coupling with a plurality of optical fibers and transmitting and receiving optical signal over the optical fibers.

BACKGROUND OF THE INVENTION

It is contemplated that an optical system unit for optical transceiver for coupling with a plurality of optical fibers and transmitting and receiving optical signals over the optical fibers is equivalent to a connection hub (a cable coupler) for coupling a group of LAN (local area network) cables for a local network such as in an office.

Any LAN cable for transmission of electric signals can be joined at one end to a relatively smaller connector and also can transmit and receive a signal over a single line. Accordingly, the hub for coupling the LAN cables for electric signals is common available of a compact size.

On the contrary, a conventional optical system unit for optical transceiver is designed having a desired number of connectors, each connector joined with a fiber optic cable accommodating a transmission optical fiber and a fiber optic cable accommodating a reception optical fiber.

FIG. 9 schematically illustrates a primary part of such a conventional optical system unit for optical transceiver. The conventional optical system unit for optical transceiver 101 may be coupled with two or more connectors 102. The connector 102 is joined with one end of a transmission fiber optic cable 103 and one end of a reception fiber optic cable 104. The optical system unit for optical transceiver 101 includes a transmission lens 107 located opposite to and spaced by a certain distance from the end of a transmission optical fiber 106 accommodated in the transmission fiber optic cable 103 of the connector 102. Similarly, it includes a reception lens 109 located opposite to and spaced by a certain distance from the end of a reception optical fiber 108 accommodated in the reception fiber optic cable 104. Provided on the other side of the lenses 107 and 109 opposite to the connector 102 side is a lead frame 111. A light emitting diode 112 and a photo diode 113 are mounted on the lead frame 111 to face the transmission lens 107 and the reception lens 109 respectively.

In FIG. 9, the connector 102 is illustrated as a single unit. It is understood that the optical system unit 101 for optical transceiver when coupled with two or more of the connectors 102 includes a corresponding number of such optical systems.

As the connector 102 is joined with the two fiber optic cables 103 and 104, the conventional optical system unit for optical transceiver 101 is relatively large in the overall size. This allows the transmission lens 107 and the reception lens 109 to be used of large size. Also, this permits the light emitting diode 112 and the photo diode 113 to be generously spaced from each other, thus improving the separation between a transmission signal and a received signal.

However, as its connector 102 is large, the conventional optical system unit for optical transceiver 101 becomes bulky in the dimensions. As compared with the LAN cable joined hub as a like unit for transmission and reception of electric signals, the conventional optical system unit for optical transceiver 101 may be too large. It is hence proposed to provide a modified optical system unit for optical transceiver which can be coupled with a smaller connector accompanied with a single fiber optic cable for transmission and reception of optical signals.

FIG. 10 is an enlarged view showing schematically a modified optical system unit for optical transceiver coupled with one end of the fiber optic cable. The fiber optic cable 121 includes a transmission optical fiber 122 and a reception optical fiber 123 joined closely to each other by a distance L. The distance L may be as short as 0.75 mm. As a result, a connector 124 joined with the fiber optic cable 121 can be decreased to a size equal to that of the common LAN cable connector for electric signals. Consequently, the modified optical system unit for optical transceiver 125 coupled with the connector 124 will be minimized in the size.

However, when the distance L between the two optical fibers 122 and 123 is very small, their corresponding lenses 126 and 127, the light emitting diode 128, and the photo diode 129 may hardly be aligned with the two optical fibers 122 and 123. For compensation, a group of mirrors 131 to 134 are utilized to separate the two optical paths 135 and 136, denoted by the one-dot chain lines, from each other in directions orthogonal to the axes of the optical fibers 122 and 123 as shown in FIG. 10. Such a technique is disclosed in "Opto-com", pp. 60, April 1998.

As the modified optical system unit for optical transceiver 125 shown in FIG. 10 includes the mirrors 131 to 134 for transmitting and receiving a pair of optical signals, its price will unfavorably be increased. Accordingly, some attempts for forming the lenses and the mirrors integrally by molding of an optically transparent material have been proposed. One of the attempts is depicted in the Electric Components & Technology Conference 1998 proceeding, "Low Wave Length Transparent Epoxy Mold Optical Data Link" by Ichiro Tonai et al.

FIG. 11 is a view of the connector coupling end of such a modified optical system unit for optical transceiver described in the above proceeding, seen from the connector side. FIG. 12 is a cross sectional view of the modified optical system unit for optical transceiver 101 taken along the line A—A of FIG. 11 vertical to the sheet of paper. As shown in FIG. 12, the optical system unit for optical transceiver 141 is coupled with a connector 142.

The connector 142 shown in FIG. 12 is joined with a two-core fiber optic cable 145 having a transmission optical fiber 143 and a reception optical fiber 144. The connector 142 has two M type ferrule positioning holes 146 and 147 provided in the front side thereof. When its M type ferrule positioning holes 146 and 147 are in engagement with a pair of corresponding M type ferrule positioning pins 148 and 149 mounted at the opposite positions on the front side of the optical system unit for optical transceiver 141, the connector 142 is correctly coupled with the optical system unit for optical transceiver 141.

The optical system unit for optical transceiver 141 incorporates a resin body 151 in which the two M type ferrule positioning pins 148 and 149 are implanted. In the resin body 151, each of the opposite position of the transmission optical fiber 143 and the reception optical fiber 144 project hemispherically, and the resin body 151 construct the convex lens 152 and 153, respectively. The resin body 151 is made of a transparent resin material which is transparent for both a mode of light transmitted to the transmission optical fiber 143 and a mode of light received from the reception optical fiber 144. Also, a lead frame 155 of a sheet form is embedded in the resin material 151 to extend on a plane orthogonal to the M type ferrule positioning pins 148 and 149. A light emitting device 156 for emitting light via the lens 152 to the transmission optical fiber 143 is mounted on the lead frame 155 to face the transmission optical fiber 143. Also, a light receiving device 157 for receiving light transmitted via the lens 153 from reception optical fiber 144 is mounted on the lead frame 155 to face the bet reception optical fiber 144. The light emitting device 156 is connected by a wire 161 to a transmission signal line 158 which is provided flush with the lead frame 155. Similarly, the light receiving device 157 is connected by a wire 162 to a reception signal line 159 which is provided flush with the leaf frame 155.

In the optical system unit for optical transceiver 141 having the above arrangement, both the light emitting device 156 and the light receiving device 157 are mounted on the single lead frame. Accordingly, the distance from the light emitting device 156 to the end of the fiber optic cable 145 is equal to that from the light receiving device 157. In practice, the light emitting device 156 and the light receiving device 157 may commonly be different from each other in the optical characteristics including the size of the light transmitting or receiving area. For compensation, the two convex lenses 152 and 153 are separately designed and fabricated for giving optimum effects to different focal length or aberration.

The modified optical system unit for optical transceiver 141 shown in FIGS. 11 and 12 allows the light emitting device 156 and the light receiving device 157 to be aligned with the transmission optical fiber 122 and the reception optical fiber 123 respectively, thus eliminating the mirrors which are essentially provided in the previous optical system unit for optical transceiver 125 shown in FIG. 10. Also, as its lenses are fabricated by molding of a resin material, the optical system unit for optical transceiver 141 will be improved in the cost down.

However, the optical system unit for optical transceiver 141 shown in FIGS. 11 and 12 has the transmission optical fiber 122 and the reception optical fiber 123 spaced from each other by the distance L which is as short as 0.75 mm similar to that shown in FIG. 10. Accordingly, because the two convex lenses 152 and 153 formed integral with the resin body 141 by the molding process are very small in the size, their dimensional accuracy enough to have desired lengths of the focal distance may hardly be feasible.

The reduction of the number of components by molding the resin material may be achieved with the system unit shown in FIG. 10. More particularly, while the two lenses 126 and 127 are formed as a pair of arcuate projections as shown in FIGS. 11 and 12, the mirrors 131 to 134 are implemented by facets exposed to the air. As a result, those optical components are formed in a single unit. Accordingly, the lenses will no more be fabricated separately and the optical system unit for optical transceiver will be reduced in the production cost. It is however true that the resin material expands or contracts as the temperature changes. In case chat the mirrors are formed on facets tilted at a certain angle, any change in the ambient temperature ranging from −40 to +85° C. may generate angular variation or distortion on the tilted facets. Consequently, the optical system unit for optical transceiver 125 shown in FIG. 10 can be formed by molding the resin material but with an unfavorable level of the optical characteristics.

SUMMARY OF THE INVENTION

It is thus an object of the present invention to provide an optical system unit for optical transceiver which is so formed integral with lenses by molding of a resin material as to exhibit a favorable level of the optical characteristics with no use of mirrors.

According to claim 1 of the present invention, an optical system unit for optical transceiver is provided comprising: (a) a transmission lens and a reception lens formed of an optically transparent resin material to project at the distal end of an arcuate contour towards and locate in front of one end of a transmission optical fiber and one end of a reception optical fiber respectively which are spaced by a certain distance from each other and accommodated in a single fiber optic cable; (b) a lead frame provided in the optically transparent resin material and formed by bending to have two steps so that the distances of the two steps along the axes of the optical fibers from the one end of the transmission optical fiber and the one end of the reception optical fiber respectively are different; (c) a light emitting device provided in the optically transparent resin material as located on one step of the lead frame to face the one end the transmission optical fiber; and (d) a light receiving device provided in the optically transparent resin material as located on the other step of the lead frame to face the one end the reception optical fiber.

As defined in claim 1, the transmission lens and the reception lens are formed integrally by a resin material which is transparent for the applied wavelengths of light so as to face the transmission optical fiber and the reception optical fiber respectively of a fiber optic cable and the distance between the light emitting device and the light receiving device is determined on the basis of the optical characteristic of the two lenses. Accordingly, the optical system becomes simpler in the arrangement with no use of mirrors. In addition, the transmission lens and the reception lens can commonly be used as are identical in the optical characteristics and the data of conventional similar lenses can be utilized for designing. This will facilitate the designing process of the system unit hence contributing to the speed-up and the cost down of the development and manufacturing. Moreover, as no mirrors are used, the system unit will remain stable regardless of changes in the ambient temperature. The single lead frame is bent to such a shape that the bent can successfully shield unwanted components of the light emitted from the light emitting device. Also, the difference in the distance to the lens between the light emitting device and the light receiving device can easily be controlled by varying the angle of bending the lead frame.

According to claim 2 of the present invention, the optical system unit for optical transceiver defined in claim 1 is modified in which the lead frame has rows of perforations provided therein along the bending lines so that the distances of the steps can be adjusted by varying the angle of bending.

As defined in claim 2, the lead frame according to claim 1 has the rows of perforations provided therein along the bending lines. Accordingly, the light emitting device and the light receiving device mounted on the lead frame are free from excessive stress developed during the bending process and can thus be prevented from unwanted physical damage.

According to claim 3 of the present invention, an optical system unit for optical transceiver is provided comprising: (a) a transmission lens and a reception lens formed of an optically transparent resin material to project at the distal end of an arcuate contour towards and locate in front of one end of a transmission optical fiber and one end of a reception optical fiber respectively which are spaced by a certain distance from each other and accommodated in a single fiber optic cable; (b) a first lead frame and a second lead frame provided in the optically transparent resin material and located so that their distances along the axes of the optical fibers from the one end of the transmission optical fiber and the one end of the reception optical fiber respectively are different; (c) a light emitting device provided on the first lead frame to face the one end the transmission optical fiber; and (d) a light receiving device provided on the second lead frame to face the one end the reception optical fiber.

As defined in claim 3, the transmission lens and the reception lens are formed by the transparent resin material, which is transparent for wavelengths of light to be used, so as to face the end of the transmission optical fiber and the end of the reception optical fiber respectively of the fiber optic cable. The two, first and second, lead frames are embedded in the resin material so that the distance between the light emitting device and the light receiving device can be determined arbitrarily and separately depending on the optical characteristics of the two resin lenses. Accordingly, the optical system can be simple in the arrangement with no use of mirrors for reflecting the light. In addition, the transmission lens and the reception lens can commonly be used as are identical in the optical characteristics and the data of conventional similar lenses can be utilized for designing. This will facilitate the designing process of the system unit hence contributing to the speed-up and the cost down of the development and manufacturing. Moreover, as no mirrors are used, the system unit will remain stable regardless of changes in the ambient temperature.

According to claim 4 of the present invention, the optical system unit for optical transceiver defined in claim 3 is modified in which one of the first and second lead frames which is nearer to the one end of the optical fiber has a window-like opening provided therein for clearing the optical path to the light transmitting or receiving device mounted on the other lead frame.

As a result, the two lead frames can be placed one over the other. This will implement the spatial arrangement of the two lead frames readily and accurately in the molding process of the resin material.

According to claim 5 of the present invention, the optical system unit for optical transceiver defined in claim 4 is modified in which the other lead frame also has a window-like opening provided therein at the same position as of the opening of the nearer lead frame and a light receiving device of back-side reception type is mounted to the side opposite to the optical fiber facing side of the other lead frame with its light receiving surface oriented to face the one end of the optical finer across the two openings.

As defined in claim 5, the light receiving device of back-side reception type can be used having relevant terminals mounted on the side opposite to the light receiving side. The difference between the distance of the light emitting device to its corresponding lens and the distance of the light receiving device to its corresponding lens can be adjusted by controlling the thickness of the two lead frames.

According to claim 6 of the present invention, the optical system unit for optical transceiver defined in claim 3 is modified in which a shielding sheet made of a conductive material is provided between the first lead frame and the second lead frame for inhibiting the light receiving device from receiving unwanted components of the light emitted from the light emitting device and connected to the ground for eliminating electrical noises.

The shielding sheet is provided between the two, first and second, lead frames and connected to the ground for eliminating electrical and optical noises. Alternatively, besides the shielding sheet, one of the first and second lead frames may be bent at its end to protect the light receiving device from receiving unwanted components of the light from the light emitting device.

According to claim 7 of the present invention, an optical system unit for optical transceiver is provided comprising: (a) a transmission lens and a reception lens formed of an optically transparent resin material to project at the distal end of an arcuate contour towards and locate in front of one end of a transmission optical fiber and one end of a reception optical fiber respectively which are spaced by a certain distance from each other and accommodated in a single fiber optic cable; (b) a lead frame provided in the optically transparent resin material, arranged in parallel with a plane on which the axes of the transmission optical fiber and the reception optical fiber extend, and formed to such a shape that the distances of two portions of its upper edge from the one end of the transmission optical fiber and the one end of the reception optical fiber respectively are different; (c) a light emitting device provided on one portion of the upper edge of the lead frame with its light emitting surface oriented to face the one end the transmission optical fiber; and (d) a light receiving device provided on the other portion of the upper edge of the lead frame with its light receiving surface oriented to face the one end the reception optical fiber.

As defined in claim 7, the lead frame is arranged at a right angle to the orientation of the previous lead frames. Since one end of the lead frame becomes opposite to the end of the transmission optical fiber and the end of the reception optical fiber, the light emitting device and the light receiving device mounted on the lead frame are used of side emission type and of side reception type respectively. Accordingly, the light emitting surface and the light receiving surface of the devices can be set to face the transmission optical fiber and the reception optical fiber respectively.

According to claim 8 of the present invention, the optical system unit for optical transceiver defined in any of claims 1, 3, and 7 is modified in which the transmission lens, the reception lens, and the relevant components are provided two or more sets corresponding to a number of the fiber optic cables employed.

The optical system unit for optical transceiver is not only one applicable to a single fiber optic cable but also capable of coupling with two or more fiber optic cables. According to the present invention, the light emitting device and the light receiving device are favorably aligned with the optical fibers of each fiber optic cable without using the conventional optical system where the optical paths are distanced from each other as shown in FIG. 10. Therefore, the optical system unit for optical transceiver can be minimized in the overall arrangement.

DETAILED DESCRIPTION OF THE PREFERRED EMBODIMENTS

Some embodiments of the present invention will be described in more detail.

First Embodiment

Figure 1:
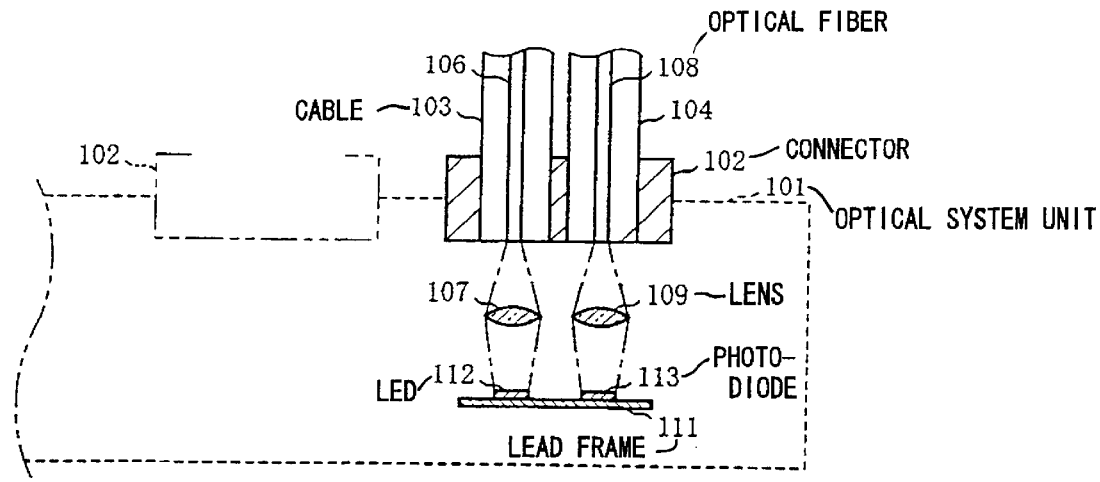
FIG. 1 is a schematic view showing a primary part of a conventional optical system unit for optical transceiver coupled with two fiber optic cables for transmission and reception of optical signals respectively.
Figure 2:
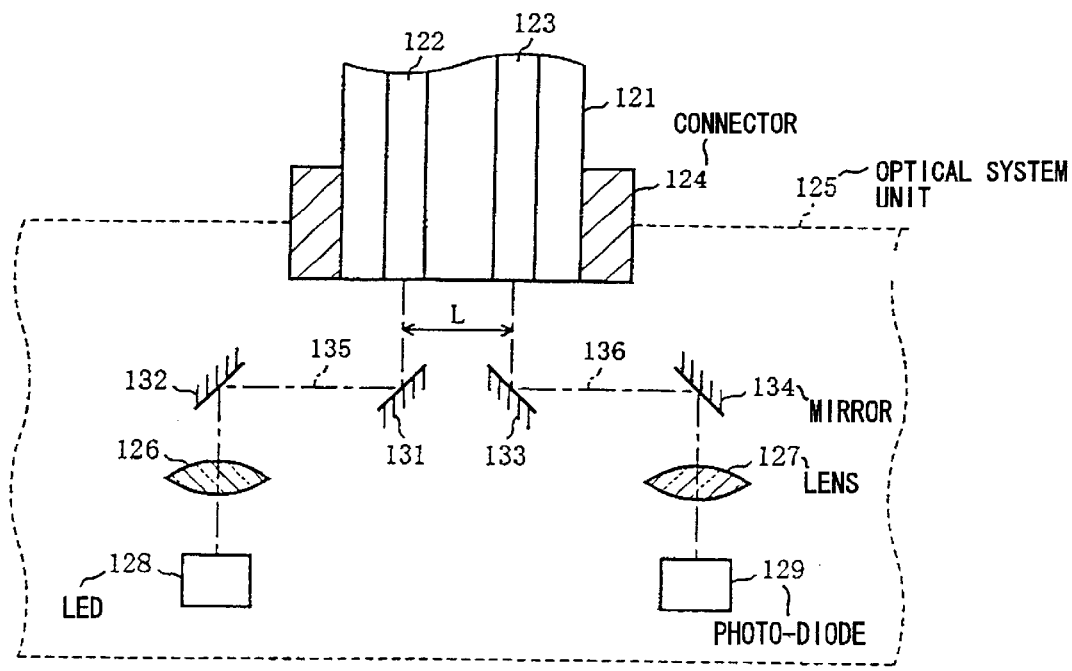
FIG. 2 schematic view showing a primary part of a conventional optical system unit for an optical transceiver coupled with a two-core fiber optic cable and arranged in which two optical paths for transmission and reception are widely separated from each other.
Figure 12:
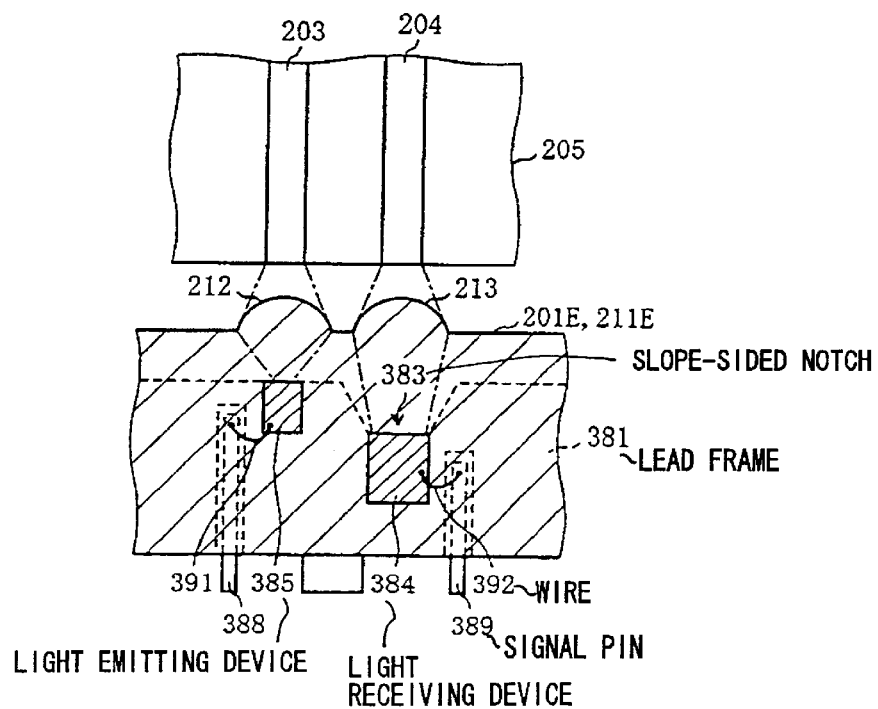
FIG. 12 is a cross sectional view of an optical system unit for optical transceiver according to the sixth embodiment with the coupling end of a fiber optic cable positioned opposite.

FIG. 1 is an opened-up view of a connector coupling side of an optical system unit for optical transceiver, seen from the connector side, illustrating the first embodiment of the present invention. FIG. 2 is a cross sectional view of the optical system unit for optical transceiver taken along the line B—B of FIG. 1 vertically of the sheet of paper. As shown in FIG. 12, the optical system unit for optical transceiver 201 is coupled with a connector 202 (an MT ferrule).

The connector 202 shown in FIG. 2 includes a two-core fiber optic cable 205 which comprises a transmission optical fiber 203 and a reception optical fiber 204. The connector 202 has a couple of M type ferrule positioning holes 206 and 207 provided in the coupling side thereof. With its M type ferrule positioning holes 206 and 207 engaged with two M type ferrule positioning pins 208 and 209 mounted on the coupling side of the optical system unit for optical transceiver 201, the connector 202 can be coupled with the optical system unit for optical transceiver 201 at the correct positional relationship. The connector 202 may commercially be available as an MT ferrule or a two-core array terminal standardized by IEC (the International Electrotechnical Commission) 874–16. More particularly, the connector 202 is joined with the fiber optic cable 205 and then polished at the coupling side.

Figure 9:
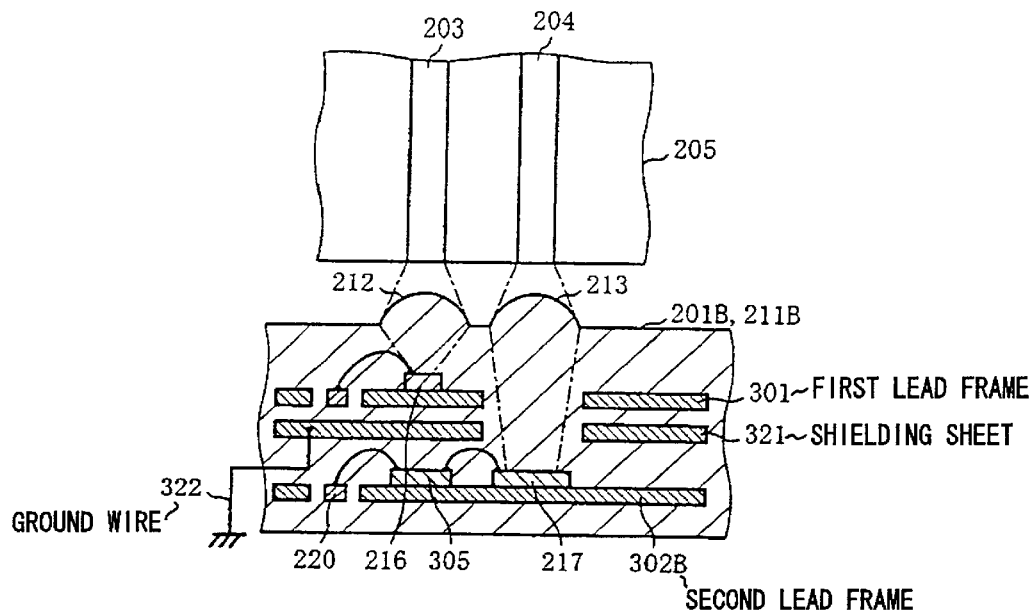
FIG. 9 a cross sectional view of an optical system unit for optical transceiver according to the third embodiment with the coupling end of a fiber optic cable positioned opposite.

The two M type ferrule positioning pins 208 and 209 are implanted in a resin body 211 of the optical system unit for optical transceiver 201. While the single resin body 211 only is illustrated, two or more of the resin bodies 211 may be provided in the optical system unit 201 for coupling with a corresponding number of the connectors 202, as described previously with FIG. 9.

Figure 11:
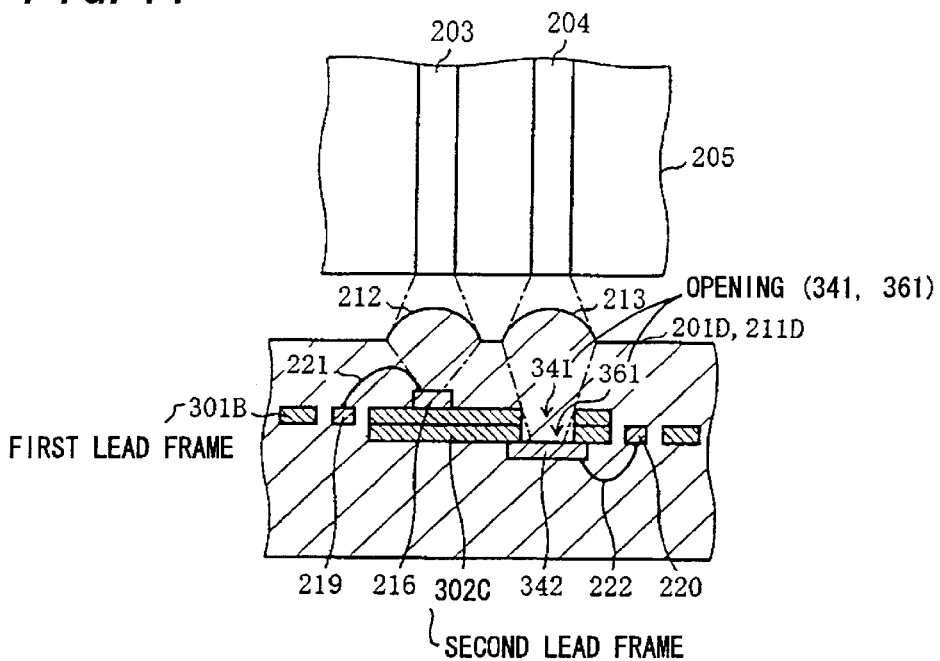
FIG. 11 is a cross sectional view of an optical system unit for optical transceiver according to the fifth embodiment with the coupling end of a fiber optic cable positioned opposite.

The resin body 211 has two semicircular projections thereof located opposite to the transmission optical fiber 203 and the reception optical fiber 204 respectively as shaped to serve as two convex lenses 212 and 213. The two convex lenses 212 and 213 are identical to each other in the optical characteristics, dissimilar to those shown in FIGS. 11 and 12. The resin body 211 is made of a transparent resin material which can transmit two discrete, input and output, modes of light received from the reception optical fiber 204 and transmitting to the transmission optical fiber 203. The resin material employed in this embodiment may be selected from a group of materials which are transparent or can transmit the two modes of light used for the transmission and the reception of signals even if they are opaque or semi-opaque at the visible light. More specifically, because the two modes of light used in this embodiment are 0.85 ?m and 1.31 ?m in wavelength, the resin material is preferably one which can transmit those wavelengths of light or provide minimum loss of the light having the wavelengths. The resin material is not limited to being transparent at the visible light but may have a black color at extreme.

The resin body 211 has a lead frame 215 embedded therein. The lead frame 215 is bent to have a slope at the center and two, upper and lower, step portions 215A and 215B at both the ends thereof extending in parallel with a plane perpendicular to the M type ferrule positioning pins 208 and 209. A light emitting device 216 for emitting light via the lens 212 to the transmission optical fiber 203 is mounted on the upper step portion 215A to face the transmission optical fiber 203. Also, a light receiving device 217 for receiving light via the lens 213 from the reception optical fiber 204 is mounted on the lower step portion 215B to face the reception optical fiber 204. The light emitting device 216 is connected by a wire 221 to a transmission signal line 219 provided flush with the upper step portion 215A of the lead frame. Similarly, the light receiving device 217 is connected by a wire 222 to a transmission signal line 220 provided flush with the lower step portion 215B of the lead frame.

The light emitting device 216 is of a surface-emission type and may typically be an LED (light emitting diode) or VCSEL (vertical cavity surface emitting laser). The light receiving element 222 may be a surface-reception type PD (photo-diode) based on Si (silicon) or InGaAs (indium-gallium-arsenide).

Figure 3:
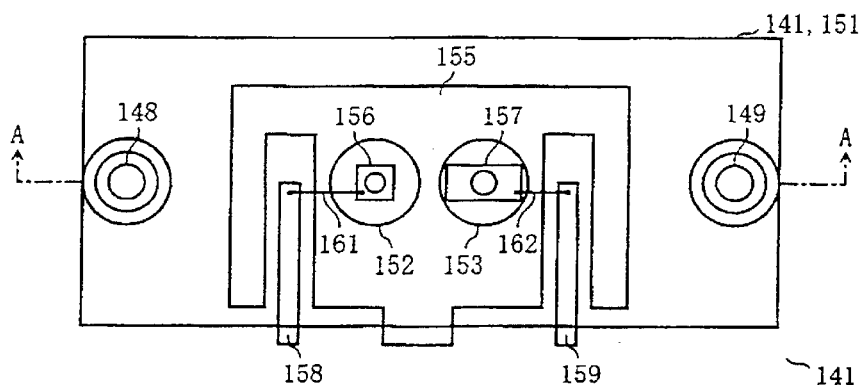
FIG. 3 is a plan view of a conventional optical system unit for an optical transceiver coupled with a two-core fiber optic cable and arranged in which two optical paths for transmission and reception are not widely separated from each other.

FIG. 3 illustrates the lead frame 215 before bent to a shape, accompanied with the transmission signal line and the reception signal line. The lead frame 215 is cut out from a metal sheet. Then. the light emitting device 216 and the light receiving device 217 are mounted on the lead frame 215 and connected by the wires 221 and 222 to the transmission signal line 219 and the reception signal line 220 respectively. The lead frame 215 has two lines of perforations 231 and 232 provided in substantially the center thereof as spaced from each other by a certain distance. When the lead frame 215 is bent along the two perforation lines 231 and 232, its developing stress at the bents can be lessened. This prevents the light emitting device 216 and the light receiving device 217 mounted on their respective upper and lower step portions 215A and 215B of the lead frame 215 from receiving any undesired stress, hence eliminating critical faults such as physical fractures. Also, this permits the upper step portion 215A and the lower step portion 215B to be held linear and thus in parallel with each other.

The setting of the optical system unit for optical transceiver 201 having the above arrangement is now explained. As described, the distance L between the transmission optical fiber 203 and the reception optical fiber 204 is as short as 0.75 mm in the optical system unit for optical transceiver 201 of this embodiment. This allows the two convex lenses 212 and 213 to have the same shape hence simplifying the design of the arrangement. The two convex lenses 212 and 213 are made of the resin material and their optical characteristics including a focal distance may be unsteady in the accuracy. However, when the two convex lenses 212 and 213 are formed with the use of a single set of molds which are carefully designed, their optical characteristics shall hardly be varied from one another but substantially remain identical in view of practical use.

As the resin body 211 of the optical system unit for optical transceiver 201 has been formed to a desired shape, the distance between the convex lenses 212 and 213 and their corresponding light emitting device 216 and light receiving device 217 respectively is measured to determine an ideal length. For setting the distance to the desired length, the upper step portion 215A and the lower step portion 215B are spatially positioned by adjusting the angle of bending of the lead frame 215. More specifically, the lead frame 215 is adjusted in the angle of its bending to set the difference in the height (along the axial direction of the optical fibers 203 and 204) between the upper step portion 215A and the lower step portion 215B to a desired value. Also, the vertical position of the lead frame 215 itself is adjusted to determine an optimum distance between the two convex lenses 212 and 213 on the upper and lower step portions 215A and 215B in combination with the above described angular setting. Accordingly, in case that the two convex lenses 212 and 213 are found slightly different from each other in the optical characteristics, their difference can readily be eliminated by adjusting their relative position, thus improving the coupling effectiveness. The lead frame 215 after the adjustment is then encapsulated in a molded resin material to form the resin body 211.

Figure 10:
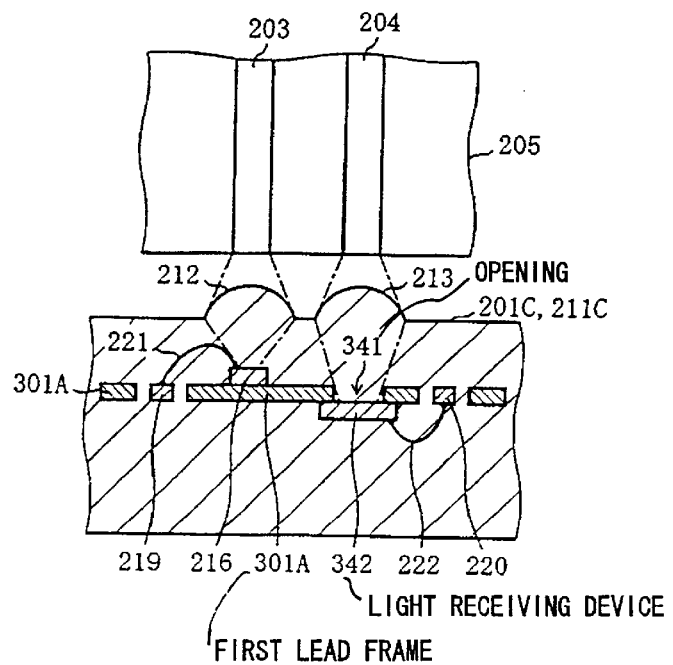
FIG. 10 is a cross sectional view of an optical system unit for optical transceiver according to the fourth embodiment with the coupling end of a fiber optic cable positioned opposite.

Moreover, the optical system unit for optical transceiver 201 of this embodiment employs no resin-made mirrors such as shown in FIG. 10. It is hence free from the disadvantage that the mirrors may be turned or deformed and dislocated from their optical axes when the resin body 211 is thermally expanded or compacted by an abrupt change in the ambient temperature.

Second Embodiment

Figure 4:
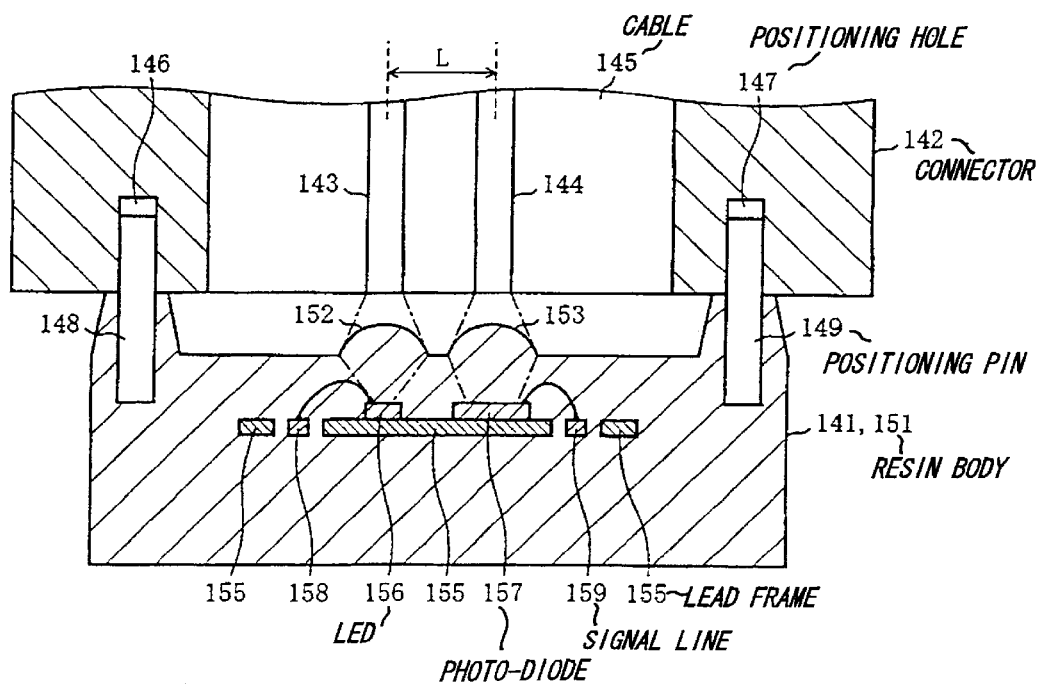
FIG. 4 is a cross sectional view of the conventional optical system unit for an optical transceiver taken along the line A—A of FIG. 3 vertical to the sheet of paper.

FIG. 4 illustrates a cross section of an optical system unit for optical transceiver of the second embodiment of the present invention with the coupling end of a fiber optic cable located opposite. In FIG. 4, like components are denoted by like numerals as those shown in FIG. 1 and will be described in no more detail.

In the optical system unit for optical transceiver 201A of the second embodiment, the two convex lenses 212 and 213 provided integrally on a resin body 211A are identical to those of the first embodiment. The resin body 211A contains two, first and second, lead frames 301 and 302 which replace the single lead frame 215 shown in FIG. 3. The light emitting device 216 is mounted on the first lead frame 301 and connected by a wire 221 to the transmission signal line 219. While the second lead frame 302 is separately disposed beneath the first lead frame 301, the light receiving device 217 is mounted on the second lead frame 302 so as to face the convex lens 213. More particularly, the first lead frame 301 has a window-like opening provided therein across the optical path between the convex lens 213 and the light receiving device 217 for clearing the beam of light released from the reception optical fiber 204.

The second lead frame 302 is arranged of an L shape in the cross section of which one end 302A facing the convex lens 212 is bent upwardly at a right angle. The one end 302A functions to shield components of the light which are emitted from the light emitting device 216, reflected at the interior of the resin body 211A, and directed towards the light receiving device 217 and to eliminate the effect of noises generated by a relatively large flow of current running in the transmission signal line 219. The other end of the second lead frame 302 opposite to the one end 302A extends beyond the light receiving device 217 and has an amplifier IC (integrated circuit) 305 mounted thereon. The amplifier IC 305 is connected by a wire 307 to the light receiving device 217 for amplification of an electrical signal produced by photoelectric conversion of the light receiving device 217. In other words, as the two perforation lines 231 and 232 (FIG. 3) of the first embodiment for bending to a shape are not used in the second embodiment, the second lead frame 302 is generously increased in the horizontal area orthogonal to the axial direction of the transmission optical fiber 203 and the reception optical fiber 204 and can thus support an extra chip such as the amplifier IC.

Third Embodiment

Figure 5:
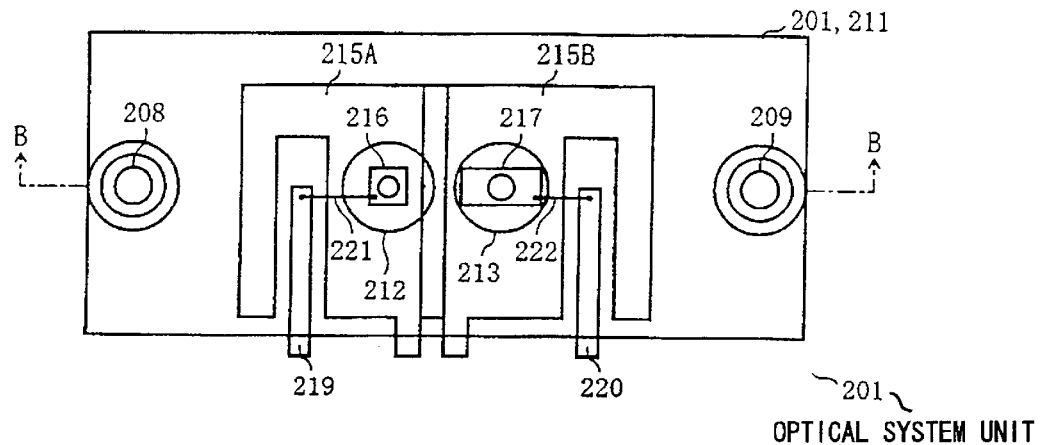
FIG. 5 is a plan view of a connector coupling side of an optical system unit for optical transceiver according to the first embodiment of the present invention, seen from the connector side.

FIG. 5 illustrates a cross section of an optical system unit for optical transceiver of the third embodiment of the present invention with the coupling end of a fiber optic cable located opposite. In FIG. 5, like components are denoted by like numerals as those shown in FIGS. 1 and 4 and will be described in no more detail.

In the optical system unit for optical transceiver 201B of the third embodiment, the first lead frame 301 is identical in the structure to that of the second embodiment shown in FIG. 4. The second lead frame 302 of the second embodiment which is bent upwardly at the one end 302A is however replaced by a second lead frame 302B which is substantially planer. In particular, a shielding sheet 321 is provided in parallel with and between the first lead frame 301 and the second lead frame 302B as spaced from both. The shielding sheet 321 is made of a conductive material such as a metal and its one end is projected out from a resin body 211B at this side of the sheet of paper and connected to the ground by a grounding wire 322. The shielding sheet 321, like the first lead frame 301, has a window-like opening provided therein to face the reception optical fiber 204. This opening allows the beam of light to pass from the reception optical fiber 204 to the light receiving device 217 without shielding.

The shielding sheet 321 functions to shield components of the light emitted from the light emitting device 216, reflected in the interior of the resin body 211B, and received as noises by the light receiving device 217 and to electrically block noises generated by a relatively large flow of current running in the transmission signal line 219. Accordingly, the one end 302A of the second lead frame 302 shown in FIG. 4 is unnecessary in the second lead frame 302B.

In the third embodiment, the three different sheets (the first lead frame 301, the second lead frame 302B, and the shielding sheet 321) are embedded at different locations and heights in the resin body 211B by molding with a resin material so that their edge portions not shown are projected out from the resin body 211B. The edge portions are then trimmed off to form the resin body 211B. The tree sheets 301, 302B, and 321 can, with no difficulty, be positioned accurately and embedded in the resin material by a known molding technique. The resin body 211A of the second embodiment may also be fabricated by the same technique.

Fourth Embodiment

Figure 6:
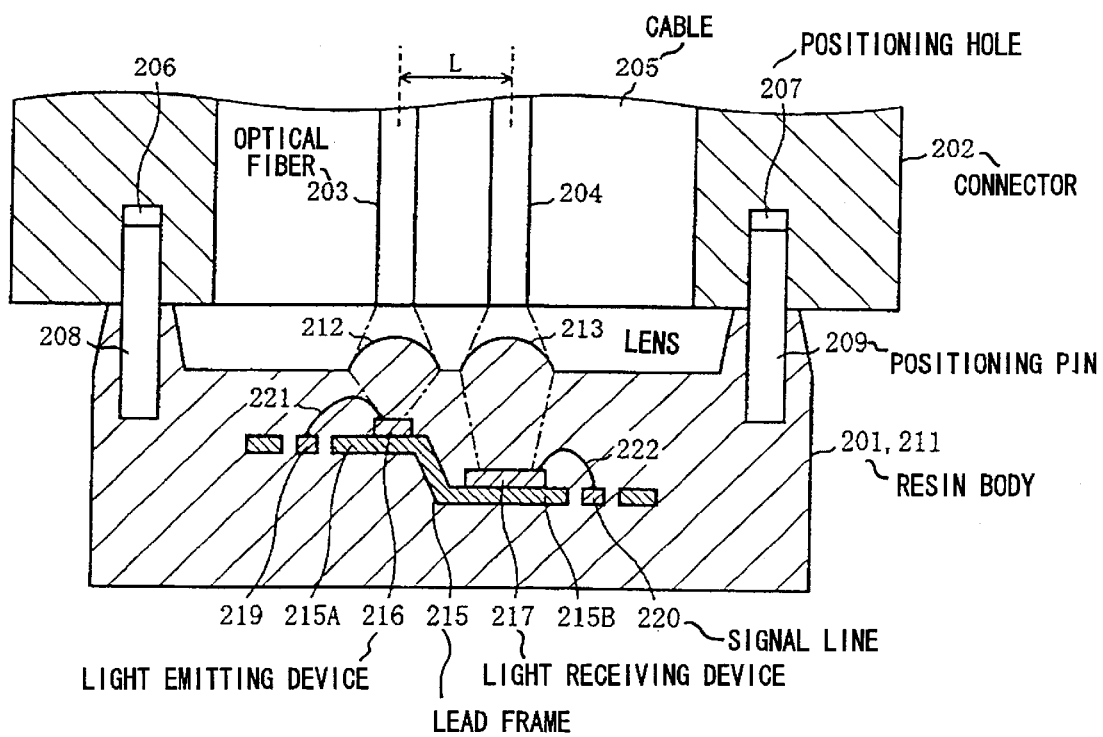
FIG. 6 is a cross sectional view of the optical system unit for optical transceiver taken along the line B—B of FIG. 1 vertical to the sheet of paper.

FIG. 6 illustrates a cross section of an optical system unit for optical transceiver of the fourth embodiment of the present invention with the coupling end of a fiber optic cable located opposite. In FIG. 6, like components are denoted by like numerals as those shown in FIGS. 1, 4, and 5 and will be described in no more detail.

In the optical system unit for optical transceiver 201C of the fourth embodiment, the first lead frame denoted by 301A is embedded in a resin body 211C, but not the second lead frame, as differentiated from the second and third embodiments. The light emitting device 216 is mounted on the first lead frame 301A so as to face the fiber optic cable 205 as similar to the first to third embodiments. The light emitting device 216 is connected by a wire 221 to the transmission signal line 219 which is disposed flush with the first lead frame 301A. The reception signal line 220 is also provided flush with the first lead frame 301A.

The first lead frame 301A of the fourth embodiment has an opening 341 provided therein to face the reception optical fiber 204 as sized slightly smaller than that of the first lead frame 301 of the second embodiment (FIG. 4). A light receiving device 342 of back-side reception is mounted to the back side of the first lead frame 301A, opposite to the front or reception optical fiber 204 side, so as to face the reception optical fiber 204 across the opening 341. The light receiving device 342 of back-side reception type is a device having external terminals mounted on the side thereof opposite to the light receiving side. As the light receiving device 342 of back-side reception type is fixedly mounted by soldering or adhesion to the back side of the first lead frame 301A, its external terminals (not shown) on the back side are connected by wire bonding of wires 222 to the reception signal line 220.

In the optical system unit for optical transceiver 201C of the fourth embodiment, the light emitting device 216 and the light receiving device 342 of back-side reception type are mounted on the back side of the first lead frame 301A. Assuming that the distance along the height between the light emitting surface and the light receiving surface is $d_1$, the thickness the light emitting device 216 is $a_1$, and the thickness of the first lead frame 301A is $b_1$, their relationship is expressed by Equation 1, $$d_1 = a_1 + b_1 \tag{1}$$

The distance $d_1$ between the light emitting surface and the light receiving surface focused by the two convex lenses 212 and 213 respectively can favorably be determined after fabrication of the resin body 211C by adjusting the thickness $a_1$ of the light emitting device 216 and the thickness $b_1$ of the first lead frame 301A. If the sum of $a_1$ and $b_1$ is smaller than the distance $d_1$, a spacer may be disposed between the light emitting device 216 and the first lead frame 301A or between the light receiving device 342 of back-side reception type and the first lead frame 301A, or two spacers between those members so that the distance $d_1$ is equal to the thickness sum of the three members. As a result, the resin body 211C will be simple in the arrangement. Also, unwanted components of the light from the light emitting device 216 will successfully be blocked. It is apparent that unwanted electrical noises can be minimized by connecting the first lead frame 301A by an unshown grinding wire to the ground.

Fifth Embodiment

Figure 7:
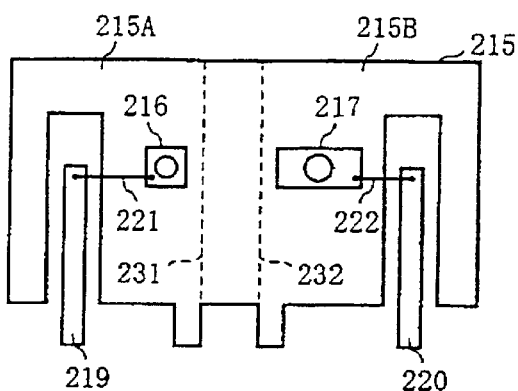
FIG. 7 is a plan view of a lead frame of the embodiment with a transmission signal line and area reception signal line before being bent.

FIG. 7 illustrates a cross section of an optical system unit for optical transceiver of the fifth embodiment of the present invention with the coupling end of a fiber optic cable located opposite. In FIG. 7, like components are denoted by like numerals as those shown in FIGS. 1, 4, 5, and 6 and will be described in no more detail.

In the optical system unit for optical transceiver 201D of the fifth embodiment, a first lead frame 301B and a second lead frame 302C are bonded to each other and embedded in a resin body 211D. The light emitting device 216 is mounted on the first lead frame 301B so as to face the transmission optical fiber 203 and to be spaced by a certain distance from the convex lens 212. The light emitting device 216 is connected by a wire 221 to the transmission signal line 219 which is disposed flush with the first lead frame 301B. The first lead frame 301B has a window-like opening 341 provided therein so as to face the reception optical fiber 204 as similar to those of the second and third embodiments.

The second lead frame 302C also has an opening 361 provided therein at the same position of but slightly smaller in the size than the window-like opening 341. Provided just beneath the two openings 341 and 361 is a light receiving device 342 of back-side reception type which is more specifically mounted on the back side of the second lead frame 302C with its light receiving side up so as to face the fiber optic cable 205. The light receiving device 342 of back-side reception type is connected by a wire 222 to the reception signal line 220 which is disposed flush with the second lead frame 302C.

In the optical system unit for optical transceiver 201D of the fifth embodiment, the light emitting device 216 is mounted on the front side of the first lead frame 301B while the light receiving device 342 of back-side reception type is mounted on the back side of the second lead frame 302C. Accordingly, assuming that the distance along the height between the light emitting surface and the light receiving surface is $d_2$, the thickness of the light emitting device 216 is $a_2$, the thickness of the first lead frame 301B is $b_2$, and the thickness of the second lead frame 302C is $c_2$, their relationship is expressed by Equation 2, $$d_2 = a_2 + b_2 + c_2 \tag{2}$$

The distance $d_2$ between the light emitting surface and the light receiving surface focused by the two convex lenses 212 and 213 respectively can favorably be determined after fabrication of the resin body 211D by adjusting the thickness $a_2$ of the light emitting device 216, the thickness $b_2$ of the first lead frame 301B, and the thickness $c_2$ of the second lead frame 302C. If the sum of $a_2$, $b_2$, and $c_2$ is smaller than the distance $d_2$, a spacer may be disposed between the light emitting device 216 and the first lead frame 301B, between the first lead frame 301B and the second lead frame 302C, or between the second lead frame 302C and the light receiving device 342 of back-side reception type, or two or more spacers between their members so that the distance $d_2$ is equal to the thickness sum of the their members. As a result, the resin body 211D will be simple in the arrangement. Also, unwanted components of the light from the light emitting device 216 will successfully be blocked. It is apparent that unwanted electrical noises can be minimized by connecting the first lead frame 301B by an unshown grinding wire to the ground.

Sixth Embodiment

Figure 8:
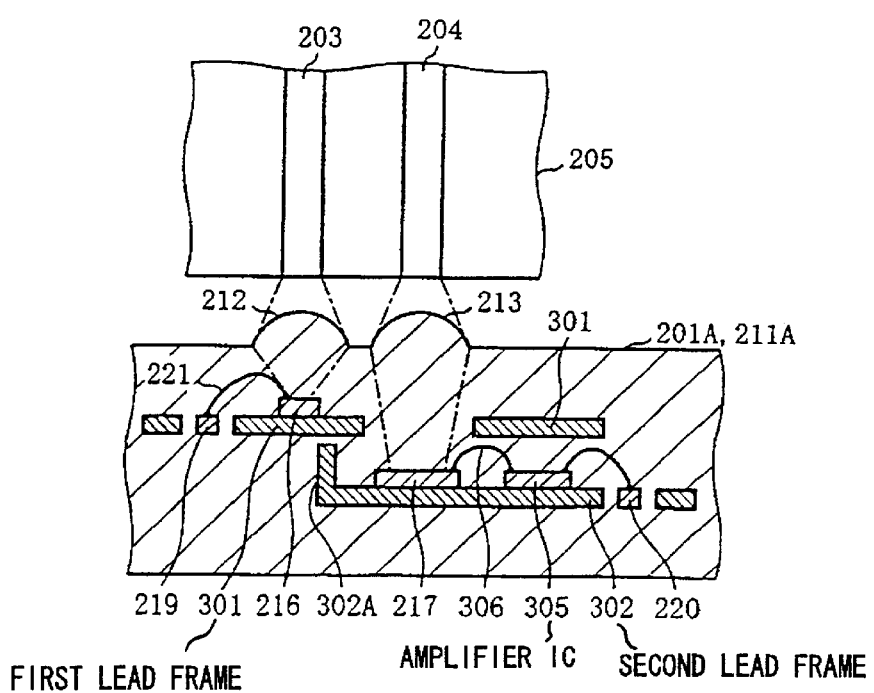
FIG. 8 is a cross sectional view of an optical system unit for optical transceiver according to the second embodiment with the coupling end of a fiber optic cable positioned opposite.

FIG. 8 illustrates a cross section of an optical system unit for optical transceiver of the sixth embodiment of the present invention with the coupling end of a fiber optic cable located opposite. In FIG. 8, like components are denoted by like numerals as those shown in FIGS. 1 and 4 will be described in no more detail.

In the optical system unit for optical transceiver 201E of the sixth embodiment, a lead frame 381 is embedded in the lower half of a resin body 211D to extend in parallel with the sheet of paper. The lead frame 381 of a sheet form has a slope-sided notch 383 provided in the upper edge thereof to face the reception optical fiber 204. A light receiving device 384 of side reception type is fixedly mounted on the lead frame 381 so that its light receiving side coincides with the bottom side of the notch 383. Also, a light emitting device 385 of side emission type is so positioned that its light emitting side is aligned with the upper edge of the lead frame 381 and faces the transmission optical fiber 203. At the position, the light emitting device 385 is fixedly secured to the lead frame 381.

The cross section of the optical system unit for optical transceiver 201E shown in FIG. 8 is taken in parallel with the sheet of paper just in front of the lead frame 381. FIG. 8 hence illustrates the resin material over the lead frame 381 removed off.

The lead frame 381 has two more notches provided in the lower edge thereof for accommodating a transmission signal pin 388 and a reception signal pin 389 respectively which are projected partially from the lower side of the resin body 211D. The transmission signal pin 388 is connected by a wire 391 to the light emitting device 385 of side emission type while the reception signal pin 389 is connected by a wire 392 to the light reception device 384 of side emission type. While the transmission signal pin 388 and the reception signal pin 389 are illustrated one single pin each, they may be provided two or more which correspond to a number of terminals on the light emitting device 385 of side emission type and the light receiving device 384 of side reception type and arranged at equal intervals in a row in the resin body 211D.

The light emitting device 395 of side emission type used in the sixth embodiment may preferably be a laser diode (LD) or the like. The light receiving device 384 of side reception type may preferably be a photo-diode of waveguide type. The light emitting device 385 of side emission type is optically coupled via the convex lens 212 to the transmission optical fiber 203 of MT type ferrule while the light receiving device 384 of side reception type is optically coupled via the convex lens 213 to the reception optical fiber 204 of MT type ferrule.

Although the two convex lenses 212 and 213 described in each embodiment are designed to be identical to each other in the optical characteristics, they when made by molding of a resin material are not intended to have the identical characteristics. It is probable that the two lenses are very similar in the optical characteristics or different more or less in the focal distance due to the accuracy of molds employed and the conditions of molding process. The present invention allows the light emitting device and the light receiving device to be positioned separately in relation to their respective lenses and can thus overcome the above mentioned discrepancies with its specific means for modifying the lead frame(s) in location. Accordingly, when the two resin lenses for transmission and reception of optical signals are differed from each other by some extent in the optical characteristic, they may be handled as identical ones. This may also permit the proved measurements of various conventional resin lenses to be directly utilized for designing without modification. Such lenses can be formed by a known molding method as parts of the optical system unit for optical transceiver made of a resin material, hence contributing to the reduction of the labor for designing of the optical system unit.

As set forth above, the present invention according to claims 1 to 8 is characterized in that the transmission lens and the reception lens are formed integrally by a resin material which is transparent for the applied wavelengths of light so as to face the transmission optical fiber and the reception optical fiber respectively of a fiber optic cable and the distance between the light emitting device and the light receiving device is determined on the basis of the optical characteristic of the two lenses. Accordingly, the optical system becomes simpler in the arrangement with no use of mirrors. In addition, the transmission lens and the reception lens can commonly be used as are identical in the optical characteristics and the data of conventional similar lenses can be utilized for designing. This will facilitate the designing process of the system unit hence contributing to the speed-up and the cost down of the development and manufacturing. Moreover, as no mirrors are used, the system unit will remain stable regardless of changes in the ambient temperature.

As defined in claim 1, the single lead frame is bent to a shape having two steps on which the light emitting device and the light receiving device are mounted respectively. The bent can successfully shield unwanted components of the light emitted from the light emitting device. Also, the difference in the distance to the lens between the light emitting device and the light receiving device can easily be controlled by varying the angle of bending the lead frame. Furthermore, as a number of its components is minimized, the system unit can be manufactured at a lower cost.

As defined in claim 2, the lead frame according to claim 1 has the rows of perforations provided therein along the bending lines. Accordingly, the light emitting device and the light receiving device mounted on the lead frame are free from excessive stress developed during the bending process and can thus be prevented from unwanted physical damage.

As defined in claim 3, the two, first and second, lead frames are embedded in the resin body so that the distance between the light emitting device and the light receiving device can be determined arbitrarily and separately depending on the optical characteristics of the two resin lenses. As compared with the single lead frame, the two lead frames can provide more rooms for installation of the components which are thus increased in the size and number.

As defined in claim 4, the two lead frames are placed one over the other while one of them having an opening provided therein for clearing the optical path. This allows the spatial arrangement of the two lead frames to be less limitable when capsulated in the resin material, whereby the components can be mounted readily and accurately.

As defined in claim 5, each of the two lead frames of the optical system unit for optical transceiver according to claim 4 has a window-like opening provided therein at the same position so that the light receiving device of back-side reception type is mounted to the back side of the lower lead frame with its light receiving surface exposed to the optical fiber across the window-like openings of the two lead frames. Accordingly, the freedom for using the device can be improved. In addition, the positional relation between the light emitting device and the light receiving device can steadily be determined by controlling the thickness of the two lead frames which are joined to each other, hence permitting the optical system unit for optical transceiver to be readily fabricated in a simple arrangement.

As defined in claim 6, the shielding sheet is provided between the two, first and second, lead frames and connected to the ground to eliminate electrical and optical noises. Accordingly, the optical system unit for optical transceiver can be reduced in the size and improved in the shielding effect.

As defined in claim 7, the lead frame is arranged at a right angle to the plane on which the lead frames according to claims 1 to 6 are arranged, thus allowing the light emitting device of side emission type and the light receiving device of side reception type to be employed.

As defined in claim 8, the optical system unit for optical transceiver can be fabricated in a smaller arrangement for coupling with a plurality of fiber optic cables.

What is claimed is:

1. An optical system unit for optical transceiver comprising:
   a transmission lens and a reception lens formed of an optically transparent resin material to project at the distal end of an arcuate contour towards and locate in front of one end of a transmission optical fiber and one end of a reception optical fiber respectively which are spaced by a certain distance from each other and accommodated in a single fiber optic cable;
   a lead frame provided in the optically transparent resin material and formed by bending to have two steps so that the distances of the two steps along the axes of the optical fibers from the one end of the transmission optical fiber and the one end of the reception optical fiber respectively are different;
   a light emitting device provided in the optically transparent resin material as located on one step of the lead frame to face the one end the transmission optical fiber; and
   a light receiving device provided in the optically transparent resin material as located on the other step of the lead frame to face the one end the reception optical fiber.

2. An optical system unit for optical transceiver according to claim 1, wherein the lead frame has rows of perforations provided therein along the bending lines so that the distances of the steps can be adjusted by varying the angle of bending.

3. An optical system unit for optical transceiver according to claim 1, wherein the transmission lens, the reception lens, and the relevant components are provided two or more sets corresponding to a number of the fiber optic cables employed.

4. An optical system unit for optical transceiver comprising:
   a transmission lens and a reception lens formed of an optically transparent resin material to project at the distal end of an arcuate contour towards and locate in front of one end of a transmission optical fiber and one end of a reception optical fiber respectively which are spaced by a certain distance from each other and accommodated in a single fiber optic cable;
   a first lead frame and a second lead frame provided in the optically transparent resin material and located so that their distances along the axes of the optical fibers from the one end of the transmission optical fiber and the one end of the reception optical fiber respectively are different;
   a light emitting device provided on the first lead frame to face the one end the transmission optical fiber; and
   a light receiving device provided on the second lead frame to face the one end the reception optical fiber.

5. An optical system unit for optical transceiver according to claim 4, wherein one of the first and second lead frames which is nearer to the one end of the optical fiber has a window-like opening provided therein for clearing the optical path to the light transmitting or receiving device mounted on the other lead frame.

6. An optical system unit for optical transceiver according to claim 5, wherein the other lead frame also has a window-like opening provided therein at the same position as of the opening of the nearer lead frame and a light receiving device of back-side reception type is mounted to the side opposite to the optical fiber facing side of the other lead frame with its light receiving surface oriented to face the one end of the optical finer across the two openings.

7. An optical system unit for optical transceiver according to claim 4, wherein a shielding sheet made of a conductive material is provided between the first lead frame and the second lead frame for inhibiting the light receiving device from receiving unwanted components of the light emitted from the light emitting device and connected to the ground for eliminating electrical noises.

8. An optical system unit for optical transceiver according to claim 4, wherein the transmission lens, the reception lens, and the relevant components are provided two or more sets corresponding to a number of the fiber optic cables employed.

9. An optical system unit for optical transceiver comprising:
   a transmission lens and a reception lens formed of an optically transparent resin material to project at the distal end of an arcuate contour towards and locate in front of one end of a transmission optical fiber and one end of a reception optical fiber respectively which are spaced by a certain distance from each other and accommodated in a single fiber optic cable;
   a lead frame provided in the optically transparent resin material, arranged in parallel with a plane on which the axes of the transmission optical fiber and the reception optical fiber extend, and formed to such a shape that the distances of two portions of its upper edge from the one end of the transmission optical fiber and the one end of the reception optical fiber respectively are different;
   a light emitting device provided on one portion of the upper edge of the lead frame with its light emitting surface oriented to face the one end the transmission optical fiber; and
   a light receiving device provided on the other portion of the upper edge of the lead frame with its light receiving surface oriented to face the one end the reception optical fiber.

10. An optical system unit for optical transceiver according to claim 9, wherein the transmission lens, the reception lens, and the relevant components are provided two or more sets corresponding to a number of the fiber optic cables employed.

* * * * *